(12) United States Patent
Rijssemus (10) Patent No.: US 8,810,334 B2
(45) Date of Patent: Aug. 19, 2014

(54) SIGNAL SPLITTER FOR USE IN MOCA/CATV NETWORKS

(75) Inventor: Martien Rijssemus, Heelsum (NL)

(73) Assignee: Technetix Group Limited, Burgess Hill (GB)

( * ) Notice: Subject to any disclaimer, the term of this patent is extended or adjusted under 35 U.S.C. 154(b) by 330 days.

(21) Appl. No.: 13/321,125

(22) PCT Filed: May 20, 2010

(86) PCT No.: PCT/GB2010/050824
§ 371 (c)(1),
(2), (4) Date: Dec. 12, 2011

(87) PCT Pub. No.: WO2010/133884
PCT Pub. Date: Nov. 25, 2010

(65) Prior Publication Data
US 2012/0081190 A1    Apr. 5, 2012

(30) Foreign Application Priority Data

May 22, 2009 (GB) .................................. 0908815.4
Jun. 24, 2009 (GB) .................................. 0910890.3

(51) Int. Cl.
*H03H 7/38* (2006.01)
*H04N 7/10* (2006.01)
*H03H 7/48* (2006.01)
*H03H 5/00* (2006.01)

(52) U.S. Cl.
CPC ............... *H04N 7/104* (2013.01); *H03H 7/482* (2013.01)
USPC ............................................ 333/131; 333/25

(58) Field of Classification Search
USPC ....................... 333/25, 26, 124, 131
See application file for complete search history.

(56) References Cited

U.S. PATENT DOCUMENTS

| | | | | |
|---|---|---|---|---|
| 3,938,046 A * | 2/1976 | Valdettaro | ..................... | 455/217 |
| 4,700,152 A * | 10/1987 | Wilson | ......................... | 333/24 C |
| 4,814,730 A * | 3/1989 | Via et al. | ........................ | 333/119 |
| 5,058,198 A | 10/1991 | Rocci et al. | | |
| 5,347,245 A * | 9/1994 | Wright, Jr. | ..................... | 333/131 |
| 6,578,202 B1 | 6/2003 | Holland | | |
| 8,058,948 B2 * | 11/2011 | Rijssemus | ..................... | 333/124 |
| 8,471,648 B2 * | 6/2013 | Rijssemus | ..................... | 333/131 |
| 2005/0289632 A1 | 12/2005 | Brooks et al. | | |
| 2013/0181789 A1 * | 7/2013 | Rijssemus | ..................... | 333/131 |

FOREIGN PATENT DOCUMENTS

WO    WO 02/093758 A2    11/2002

* cited by examiner

*Primary Examiner* — Dean O Takaoka
(74) *Attorney, Agent, or Firm* — DASCENZO Intellectual Property Law, P.C.

(57) ABSTRACT

There is provided a splitter circuit for use with a CATV network comprising a signal input in communication with a balun to supply two signal outputs, a resistor connected in parallel between the outputs, and capacitive, inductive, and resistive elements associated with the resistor, thereby to give an insertion loss in to out in the range of 3 to 10 dB.

20 Claims, 6 Drawing Sheets

SIGNAL SPLITTER FOR USE IN MOCA/CATV NETWORKS

FIELD OF THE INVENTION

This invention relates to a signal splitter for use in MoCA/CATV networks, the associated circuitry and a cable television network incorporating such signal splitters.

BACKGROUND TO THE INVENTION

A signal splitter, also known as a power splitter, for use in networks where CATV (cable television) transmission is combined with MoCA (Multimedia over Coax Alliance) transmission should have good return loss, low insertion loss and high isolation in the CATV frequency range (typically 5 MHz to 1000 MHz) to give excellent RF performance.

However for the MoCA frequency range (typically 1125 MHz to 1525 MHz), the signal splitter should ideally have a low isolation as well as a low insertion loss so as to reduce transmission loss and thus improve or, in some cases, enable MoCA transmission between output ports of a plurality of splitters within an in-home network.

Most homes have an in-home coaxial network installed to distribute TV signals to various locations. This network can also be used to distribute data or other signals to and from these locations.

With the increasing use of IP (Internet Protocol) and the internet, in-home networking is becoming very important and whilst there may be an access point in the home, it can be difficult to distribute data from this access point to and from various locations in the home. There are several technologies available to achieve this, for example PowerLine, MoCA, wireless, fibre optic, and CAT-5. These technologies all have their weaknesses.

The advantages of using the existing in-home coaxial networks are obvious: no new wires are needed and the coaxial cable is a medium with large bandwidth and very good screening. It is therefore a safe and fast medium and since it is already in place, it is also an economical solution.

However the signal dividers used in existing coaxial networks have a high isolation between output ports making two-way MoCA communication very difficult and in many cases even impossible.

It is an aim of the present invention to provide a signal splitter and associated circuit means to combine suitable RF performance in the CATV frequency range with low isolation in the MoCA frequency range.

SUMMARY OF THE INVENTION

In accordance with one aspect of the present invention, there is provided a splitter circuit means for use with a CATV network comprising a signal input in communication with a balun to supply two signal outputs, with a resistor connected in parallel between the outputs and wherein additional capacitive, inductive and resistive elements are associated with the resistor, thereby to give an insertion loss in to out in the range of 3 to 10 dB, and preferably an isolation out to out of <17 dB, for signal frequencies in the range 1125 MHz to 1525 MHz. The frequency band of 1125 to 1525 MHz is the preferred MoCA bandwidth and a splitter circuit with a low insertion loss over this frequency range improves MoCA transmission between output ports of associated splitter circuits.

Preferably a first capacitive element is connected in parallel with the resistor, with the resistor in series with a first inductive element, the resistor also in parallel with a second inductive element, a second capacitive element and a resistive element connected in series with one another. A signal splitter incorporating such a circuit will have low isolation, low insertion loss and moderate return loss for signals within the MoCA frequency range.

Desirably the first inductive element has an inductance in the range 10 nH to 40 nH, more preferably 20 nH to 40 nH, with the second inductive element having an inductance in the range 30 nH to 90 nH, more preferably 50 nH to 90 nH.

The first capacitive element may have a capacitance in the range 0.8 pF to 2.2 pF, more preferably in the range 0.8 pF to 1.0 pF, with the second capacitive element preferably having a capacitance in the range 0.3 pF to 1.0 pF, more preferably 0.3 pF to 0.5 pF.

The resistive element may have a resistance in the range 5 to 22 Ohm, where the resistor has a value in the range 56 to 200 Ohm, more preferably 150 to 200 Ohm. Typically the narrower range of values applies where the splitter circuit means is incorporated into a two-way splitter, the broader range applying for four-way splitters.

The splitter circuit means preferably has an insertion loss in to out in the range 3 to 6 dB for frequencies in the range 5 to 1000 MHz and an insertion loss in to out of 3 to 10 dB for frequencies in the range 1125 MHz to 1525 MHz. The splitter circuit means preferably has an isolation port to port of >20 dB for frequencies in the range 5 to 1000 MHz and <17 dB in the frequency range 1125 to 1525 MHz. The splitter circuit means thus is able to have suitable RF performance in the CATV frequency range while at the same time having low insertion loss, low isolation and moderate return loss for signals in the MoCA frequency range.

The invention also lies in a signal splitter incorporating at least one splitter circuit means as aforesaid, so giving two output ports which are typically associated with subscriber equipment. In such a signal splitter, the first inductive element may have an inductance in the range 20 nH to 40 nH, with the second inductive element having an inductance in the range 50 nH to 90 nH, and the first capacitive element may have a capacitance in the range 0.8 pF to 1.0 pF and the second capacitive element may have a capacitance in the range 0.3 pF to 0.5 pF, with the resistive element preferably having a resistance in the range 5 to 22 Ohm.

The signal splitter may incorporate a plurality of splitter circuit means as aforesaid so as to provide additional output ports. Typically one splitter circuit means in accordance with the invention will be connected to two splitters to provide a four-way splitter in accordance with the invention. For such a four-way splitter, the first inductive element preferably has an inductance in the range 10 nH to 20 nH, with the second inductive element having an inductance in the range 30 nH to 60 nH, and the first capacitive element may have a capacitance in the range 1.0 pF to 2.2 pF with the second capacitive element having a capacitance in the range 0.5 pF to 1.0 pF, with the resistive element having a resistance in the range 5 to 22 Ohm.

For signal splitters in which splitter circuits are combined to give 6, 8, 10 or more ports, the values for the inductive, capacitive and resistive elements will need to be selected to ensure the desired insertion loss in to out of between 3 to 10 dB and an isolation out to out of <17 dB is achieved in the MoCA frequency range.

In accordance with another aspect of the present invention, there is also provided a cable television network incorporating one or more splitter circuit means or signal splitters as aforesaid.

The invention will now be described, by way of example, with reference to the accompanying drawings in which.

DESCRIPTION

Figure 1:
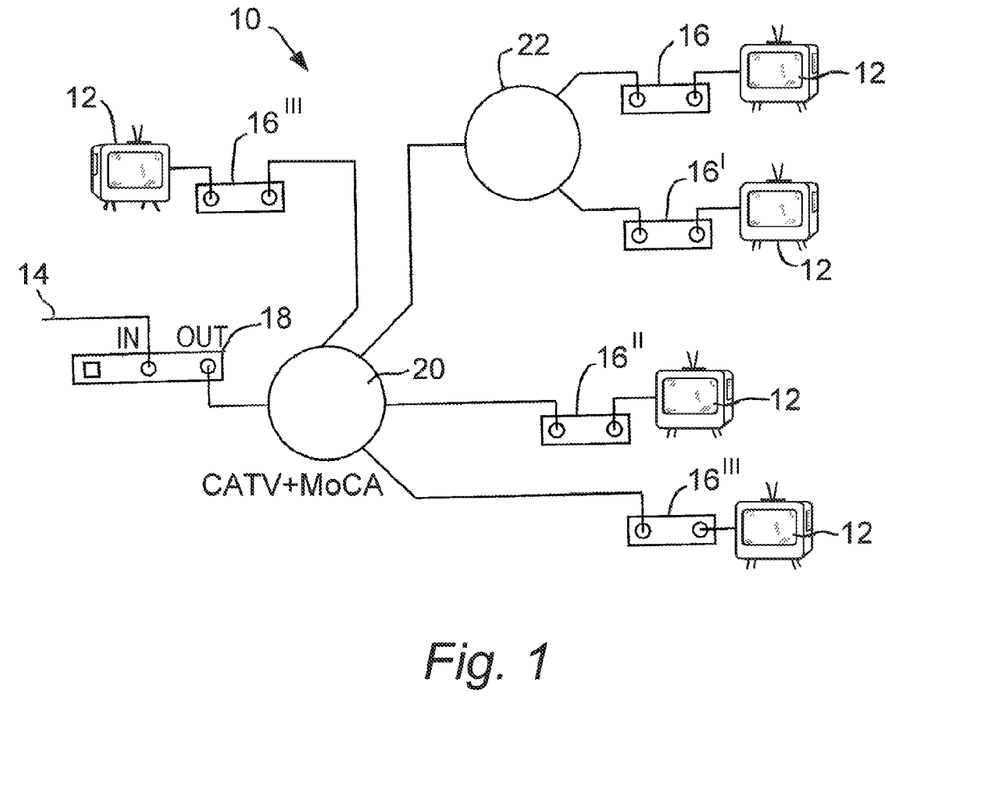
FIG. 1 shows a schematic diagram of an in-home CATV and MoCA network.

A typical in-home CATV+MoCA network configuration 10 is shown in FIG. 1. Within the home of a subscriber are a number of devices 12, such as televisions which receive a signal from a CATV network 14 and are capable of returning modified signals to the network through set-top boxes 16 which are connected via splitters to a modem 18 which receives and transmits signals to and from the CATV network 14. Within the home, there is typically more than one device receiving the signal from the CATV network and to supply a signal to each item of subscriber equipment, a four-way splitter 20 splits the incoming signal to feed a variety of devices, with if required signals from the four-way splitter being split again, for example by two-way splitter 22. These splitters act to combine the signals returned from the consumer's devices.

The signal or power splitter used in this type of combined CATV/MoCA network should have the normal specification for the CATV frequency range as these channels pass through the modem 18 (from IN to OUT) and are transmitted throughout the in-home network 10.

For transmission in the MoCA frequency range to be achieved, it is necessary to have a lower isolation between the output ports of the power splitters 20, 22 as this will lower the transmission loss. For example: suppose set-top box 16 transmits to set-top box 16'''. The MoCA transmission loss will be: insertion loss two-way splitter 22+cable losses+isolation of four-way splitter 20

For MoCA transmission from set-top box 16 to set-top box 16' this would be:
cable loss+isolation of two-way splitter 22

For MoCA transmission from modem 18 to set-top box 16 the losses will be:
insertion loss four-way splitter 20+cable losses+insertion loss two-way splitter 22.

Since the frequency of MoCA is high, the cable losses are significant but cannot be avoided. These high cable losses pose yet another problem: the return loss in the MoCA frequency range at the input of the two-way splitter will be on average:
return loss four-way splitter 22+2 times cable loss between two-way 22 and four-way splitter 20

This will increase the isolation between outputs of the two-way splitter 22 and as such increase transmission loss between certain points in the network 10.

Figure 2:
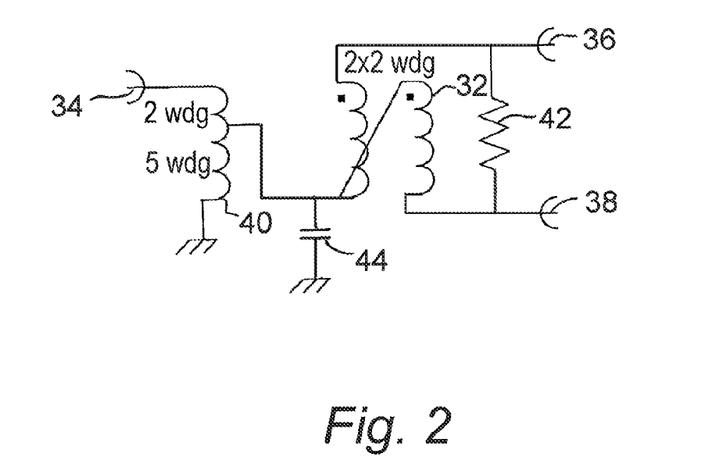
FIG. 2 shows a prior art two-way splitter.

A typical prior art two-way signal divider 30 will have a topology as shown in FIG. 2. This splitter comprises a transformer in the form of a (typical) 2×2 winding 180 degree balun (balanced to unbalance to converter) 32, also known in the art as a 'fork', which splits the signal from an input 34 to provide separate signals to two customer outputs 36, 38. The impedance at the centrepoint of the balun 32 is half of the input impedance 75 Ohm and the impedances of the outputs 36, 38, each again 75 Ohm, and in the case of a cable TV splitter is 37.5 Ohm. A resistor 42 is connected in parallel with the balun 32 and typically has a value of 150 Ohm. Frequency response compensation of the circuit is achieved by means of capacitor 44 which typically has a capacitance of around 2 pF. A step-up transformer 40 split at (typically) 2 windings and 5 windings is placed in series between the input 34 and the balun 32, transferring the 37.5 Ohm impedance (at the centre tap of balun 32) to 75 Ohm at the input.

This kind of divider has good return loss on all ports and high isolation between output ports. This is not suitable for in-home signal transmission when CATV transmission is combined with MoCA transmission, and if the transmission loss of MoCA in the in-home network is to be lowered for the MoCA frequency range, the following is required:
low isolation between output ports
low insertion loss from in to out
with a moderate return loss being acceptable.

A standard four-way power splitter is created from three standard two-way splitters as basic building blocks, as is known in the art.

Figure 3:
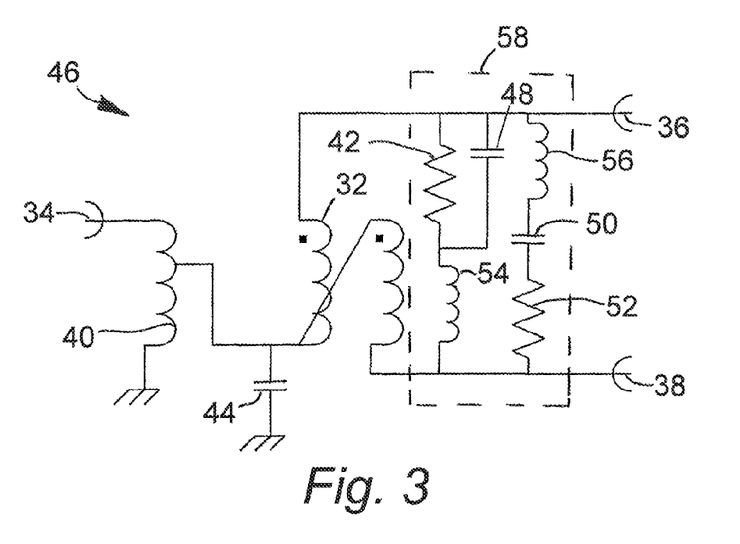
FIG. 3 shows a signal splitter in accordance with the present invention.

FIG. 3 shows a power splitter configuration in accordance with the present invention that does not have the disadvantages of the prior art power splitter shown in FIG. 2 when used in an in-home coaxial network in which CATV transmission and MoCA transmission are combined. In the signal splitter 46 shown in FIG. 3, capacitors 48, 50, resistive element, namely resistor 52 and inductors 54, 56 are added to the resistor feedback circuit in the topology shown.

Thus the resistor 42 is connected in parallel with capacitor 48 and in series with inductor 54. Inductor 56, capacitor 50 and resistor 52 are connected in series with each other, but in parallel with resistor 42, capacitor 48 and inductor 54.

The feedback circuit 58 acts as a filter with no or little influence at the CATV frequency range from 5 MHz to 1000 MHz but with low insertion loss in the MoCA frequency range from 1125 MHz to 1525 MHz. This will lower the isolation in the MoCA frequency range while, at the same time, maintaining low insertion loss, moderate return loss and excellent RF performance in the CATV frequency range.

Figure 4:
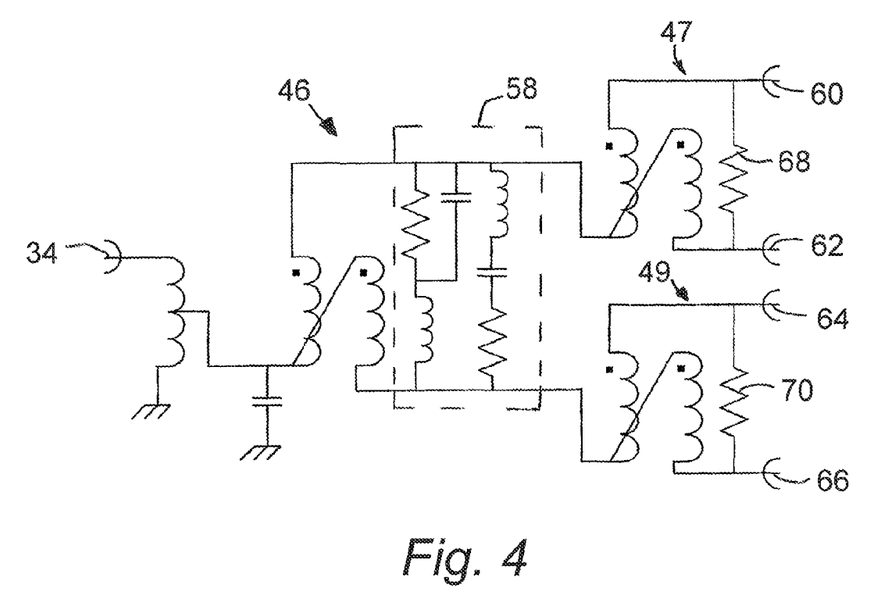
FIG. 4 shows a four-way splitter in accordance with the present invention.

Typical values for the components are:
Resistor 42: 150 to 200 Ohm
Resistor 52: 5 to 22 Ohm
Capacitor 44: depending on the used ferrite and the windings, but typically 1 pF to 3.9 pF
Capacitor 48: 0.8 pF to 1 pF
Capacitor 50: 0.3 pF to 0.5 pF
Inductor 54: 20 nH to 40 nH
Inductor 56: 50 nH to 90 nH A four-way power splitter is created from three two-way splitters as basic building blocks. This is well known in the art. A possible implementation of the present invention in a four-way splitter is shown in FIG. 4 where a first two-way splitter 46 is joined to two-way splitters 47, 49. In this case, the added filter 58 reduces isolation between first 60 and third 64 outputs, first 60 and fourth 66 outputs, second 62 and third 64 outputs and second 62 and fourth 66 outputs while, at the same time, the limited return loss of the filter reduces isolation between the first 60 and second 62 outputs and the third 64 and fourth 66 outputs.

Typical values of the components in the four-way splitter are:
Resistor 42: 56 to 100 Ohm
Resistor 52: 5 to 22 Ohm
Capacitor 44: depending on the used ferrite and the windings, but typically 1 pF to 3.9 pF
Capacitor 48: 1.0 pF to 2.2 pF
Capacitor 50: 0.5 pF to 1.0 pF Inductor 54: 10 nH to 20 nH
Inductor 56: 30 nH to 60 nH
Resistors 68 and 70: 150 to180 Ohm The characteristics of a prior art splitter and a splitter according to the invention will now be compared with reference to the graphs shown in FIGS. 5 to 8.

Figure 5:
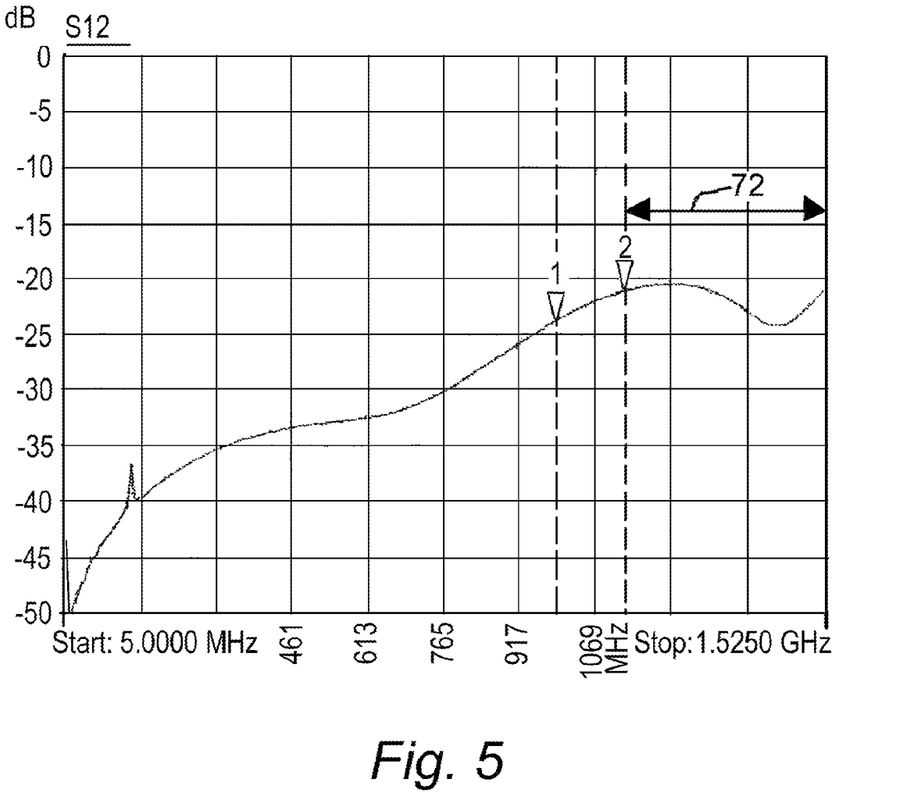
FIG. 5 is a graph depicting the isolation of the prior art splitter of FIG. 2.

FIG. 5 shows the isolation over the full frequency range of a former art two-way power splitter. It can be seen that the isolation in the MoCA frequency range 72 is >20 dB.

Figure 6:
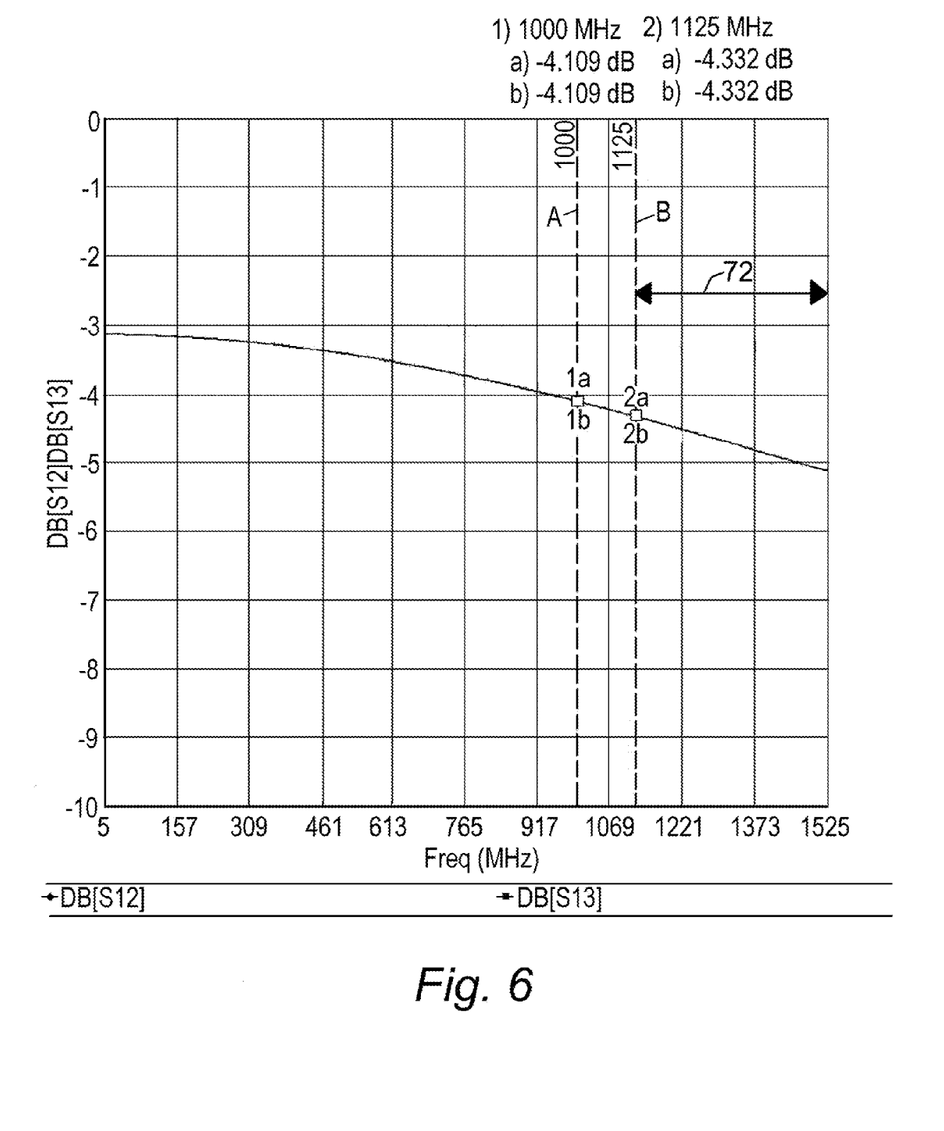
FIG. 6 is a graph showing the insertion loss of the signal splitter of FIG. 3.
Figure 7:
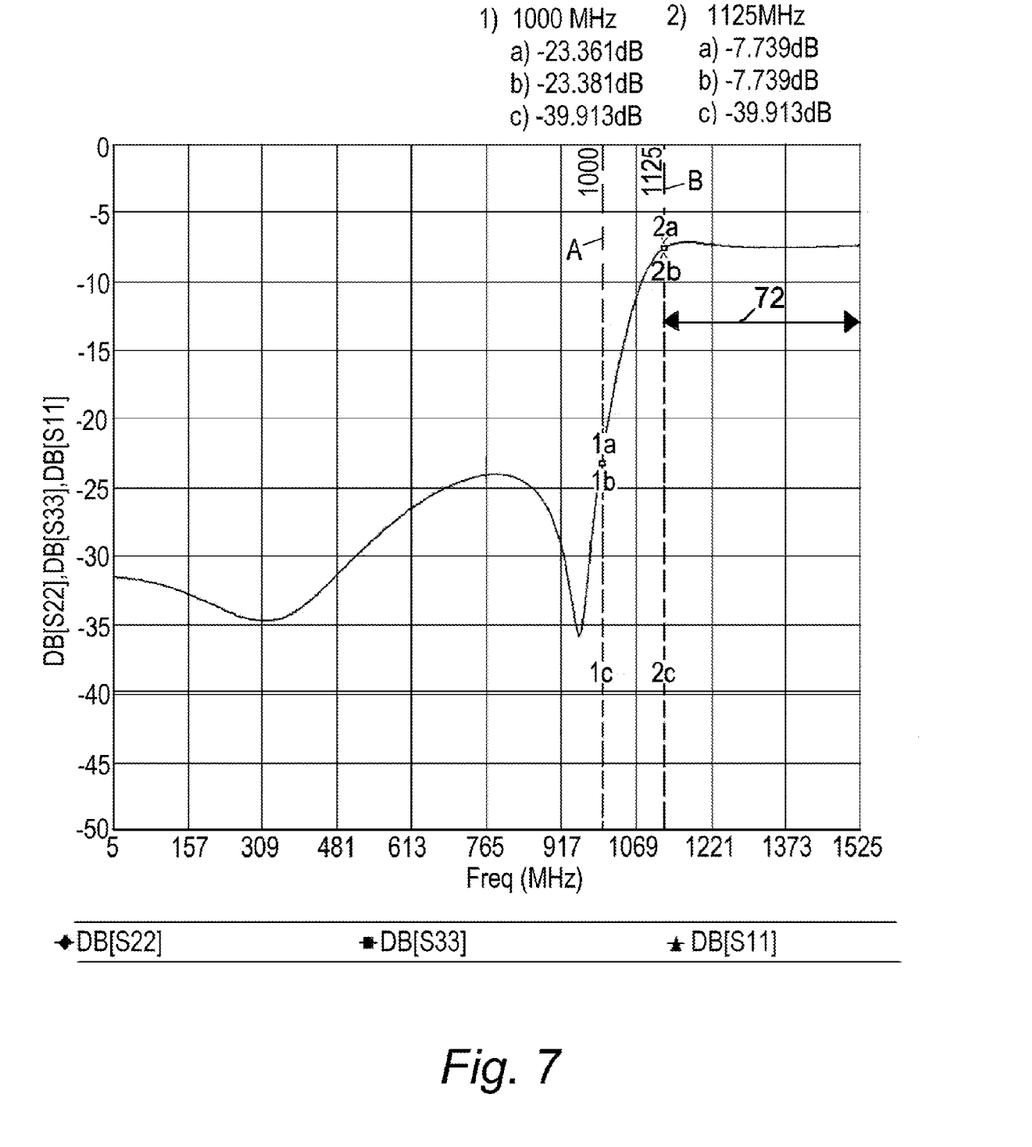
FIG. 7 is a graph depicting the return loss of the signal splitter of FIG. 3.
Figure 8:
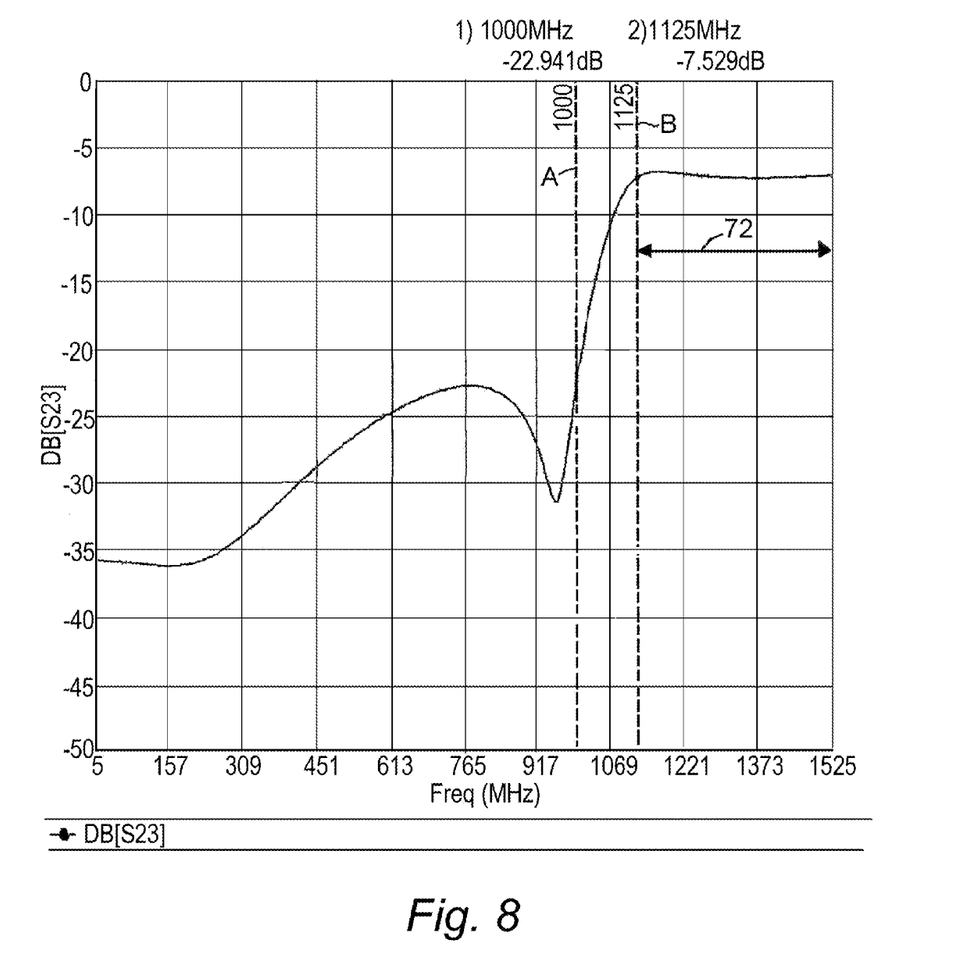
FIG. 8 is a graph depicting the isolation of the signal splitter shown in FIG. 3.

A two-way power splitter as shown in FIG. 3 will have the typical characteristics shown in FIGS. 6, 7 and 8. FIG. 6 illustrates the insertion loss from the input to output (i.e. in to out) with frequency, the CATV transmission frequency range being below point A and the MoCA frequency range being above point B. At point A the insertion loss is 4.1 dB and at point B the insertion loss is 4.3 dB. FIG. 7 illustrates the typical return loss with frequency, with the return loss in the CATV transmission frequency range ranging from around 23 dB to around 36 dB and in the MoCA frequency range around 7 to 8 dB. FIG. 8 illustrates the typical isolation across the outputs (i.e. out to out) with frequency, with the isolation in the CATV transmission frequency range ranging from around 23 dB to around 37 dB and in the MoCA frequency range around 7 to 8 dB.

Thus for a CATV transmission frequency range of 5 to 1000 MHz, the splitter of FIG. 3 has:
Insertion loss: 4 dB
Return loss : 20 dB
Isolation : 25 dB
and for a MoCA frequency range of 1125 to 1525 MHz, the splitter of FIG. 3 has:
Insertion loss : 6 dB
Return loss : 8 dB
Isolation : 8 dB It can be seen from FIGS. 5 to 8 that when using the splitter of FIG. 3, the transmission characteristics in the CATV frequency range are substantially not affected while, at the same time, the transmission loss in the MoCA frequency range improves. This is also true when more power splitters are cascaded as in a larger network or when two-way power splitters are used as basic building blocks in a four-way splitter.

This power splitter has excellent RF performance in the CATV frequency range while at the same time having low isolation, low insertion loss and moderate return loss for the MoCA frequency range.

The invention claimed is:

1. A splitter circuit for use with a CATV network, the splitter circuit comprising: a signal input; a balun in communication with the signal input to supply two signal outputs; a resistor connected in parallel between the two signal outputs; and capacitive, inductive, and resistive elements associated with the resistor, thereby to give an insertion loss in to out in the range of 3 to 10 dB for signal frequencies in the range of 1125 MHz to 1525 MHz.

2. The splitter circuit of claim 1, further comprising:
a first capacitive element connected in parallel with the resistor;
a first inductive element in series with the resistor;
a second inductive element in parallel with the resistor;
a second capacitive element; and
a resistive element connected in series with the second capacitive element.

3. The splitter circuit of claim 2, wherein the first inductive element has an inductance in the range of 10 nH to 40 nil, and wherein the second inductive element has an inductance in the range of 30 nH to 90 nil.

4. The splitter circuit of claim 3, wherein the first capacitive element has a capacitance in the range of 0.8 pF to 2.2 pF, and wherein the second capacitive element has a capacitance in the range of 0.3 pF to 1.0 pF.

5. The splitter circuit of claim 4, wherein the resistive element has a resistance in the range of 5 to 22 Ohms.

6. The splitter circuit of claim 5, wherein the splitter circuit has an insertion loss in to out in the range of 3 to 6 dB for signal frequencies in the range of 5 MHz to 1000 MHz.

7. The splitter circuit of claim 6, wherein the splitter circuit has an isolation out to out of <17 dB for frequencies in the range of 1125 MHz to 1525 MHz.

8. A signal splitter incorporating at least one splitter circuit according to claim 7.

9. A cable television network incorporating at least one signal splitter according to claim 8.

10. The splitter circuit of claim 2, wherein the first capacitive element has a capacitance in the range of 0.8 pF to 2.2 pF, and wherein the second capacitive element has a capacitance in the range of 0.3 pF to 1.0 pF.

11. The splitter circuit of claim 2, wherein the resistive element has a resistance in the range of 5 to 22 Ohms.

12. The splitter circuit of claim 1, wherein the splitter circuit has an insertion loss in to out in the range of 3 to 6 dB for signal frequencies in the range of 5 MHz to 1000 MHz.

13. The splitter circuit of claim 1, wherein the splitter circuit has an isolation out to out of 17 dB for frequencies in the range of 1125 MHz to 1525 MHz.

14. A signal splitter incorporating at least one splitter circuit according to claim 1.

15. A cable television network incorporating at least one signal splitter according to claim 14.

16. A cable television network incorporating at least one splitter circuit according to claim 1.

17. A splitter circuit for use with a CATV network, the splitter circuit comprising: a signal input; a balun in communication with the signal input to supply two signal outputs; a resistor connected in parallel between the two signal outputs; and means for giving an insertion loss in to out in the range of 3 to 10 dB for signal frequencies in the range of 1125 MHz to 1525 MHz.

18. The splitter circuit of claim 17, wherein the means for giving includes means for giving an insertion loss in to out in the range of 3 to 6 dB for signal frequencies in the range 5 MHz to 1000 MHz.

19. The splitter circuit of claim 17, wherein the means for giving includes means for giving an isolation out to out of 17 dB for frequencies in the range of 1125 MHz to 1525 MHz.

20. A signal splitter incorporating at least one splitter circuit according to claim 17.

* * * * *

UNITED STATES PATENT AND TRADEMARK OFFICE
CERTIFICATE OF CORRECTION

PATENT NO. : 8,810,334 B2
APPLICATION NO. : 13/321125
DATED : August 19, 2014
INVENTOR(S) : Martien Rijssemus It is certified that error appears in the above-identified patent and that said Letters Patent is hereby corrected as shown below:

In the Claims:

Claim 3, Column 6, Line 6, after "in the range of 10 nH to 40" please delete "nil" and insert --nH--.

Claim 3, Column 6, Line 8, after "the range of 30 nH to 90" please delete "nil" and insert --nH--.

Claim 18, Column 6, line 49, after "signal frequencies in the range" please insert --of--.

Claim 19, Column 6, lines 52-53, after "giving an isolation out to out of" please delete "17 dB" and insert --<17 dB--.

Signed and Sealed this
Twenty-eighth Day of October, 2014

Michelle K. Lee
*Deputy Director of the United States Patent and Trademark Office*